(12) United States Patent
Henson et al.

(10) Patent No.: US 12,707,675 B2
(45) Date of Patent: Aug. 11, 2026

(54) SEMICONDUCTOR DEVICE HAVING GATE TRENCHES AND FIELD PLATE TRENCHES AND A METHOD OF FABRICATING THE SEMICONDUCTOR DEVICE

(71) Applicant: Infineon Technologies Austria AG, Villach (AT)

(72) Inventors: Timothy Henson, Mount Shasta, CA (US); Harsh Naik, El Segundo, CA (US); Oliver Blank, Villach (AT); Gerhard Thomas Nöbauer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 512 days.

(21) Appl. No.: 18/329,080

(22) Filed: Jun. 5, 2023

(65) Prior Publication Data

US 2024/0405120 A1 Dec. 5, 2024

(51) Int. Cl.

| | |
|---|---|
| ***H10D 30/66*** | (2025.01) |
| ***H10D 30/01*** | (2025.01) |
| ***H10D 62/10*** | (2025.01) |
| ***H10D 64/00*** | (2025.01) |
| ***H10D 64/27*** | (2025.01) |

(52) U.S. Cl.

CPC ....... *H10D 30/668* (2025.01); *H10D 30/0297* (2025.01); *H10D 62/127* (2025.01); *H10D 64/117* (2025.01); *H10D 64/513* (2025.01)

(58) Field of Classification Search

CPC ............. H10D 30/668; H10D 30/0297; H10D 62/127; H10D 64/117; H10D 64/513

See application file for complete search history.

(56) References Cited

U.S. PATENT DOCUMENTS

| | | | | |
|---|---|---|---|---|
| 8,598,654 | B2 * | 12/2013 | Park | H10D 30/668 438/270 |
| 10,510,836 | B1 * | 12/2019 | Haase | H10D 30/0295 |
| 10,573,742 | B1 * | 2/2020 | Feil | H10D 30/668 |
| 12,051,744 | B2 * | 7/2024 | Sugawara | H10D 30/668 |
| 2017/0250256 | A1 * | 8/2017 | Siemieniec | H10D 62/127 |
| 2021/0005715 | A1 * | 1/2021 | Feil | H10D 62/393 |

* cited by examiner

*Primary Examiner* — Steven B Gauthier
*Assistant Examiner* — Khatib A Rahman
(74) *Attorney, Agent, or Firm* — Murphy, Bilak & Homiller, PLLC

(57) ABSTRACT

A semiconductor device includes: a plurality of transistor cells formed in a semiconductor body. The plurality of transistor cells includes: a plurality of stripe-shape gate trenches formed in a first main surface of the semiconductor body; and a plurality of field plate trenches separate from the stripe-shape gate trenches. At least one field plate trench is laterally interposed between each pair of neighboring stripe-shape gate trenches. Each stripe-shape gate trench includes a gate electrode, a gate dielectric between the gate electrode and a sidewall of the stripe-shape gate trench, and an oxide between the gate electrode and a bottom of the stripe-shape gate trench, the oxide having a vertical thickness that is greater than eight times a lateral thickness of the gate dielectric and/or greater than a vertical thickness of the gate electrode. A method of producing the semiconductor device is also described.

17 Claims, 7 Drawing Sheets x
y
z
102
148
108
110
104
100
136
138
134
148
108
110
104
148
100

102
200
200
134
202
104
124

102
200
200
200
134
140
144
116
112
104
124

102
134
106
104
124 x
y
z 102
206
142
134
114
104
124

208
204 x
y
z 102
104
108
110
112
114
118
120
124
132
134
136
142
150
152
154
156
206
210
x
y
z

SEMICONDUCTOR DEVICE HAVING GATE TRENCHES AND FIELD PLATE TRENCHES AND A METHOD OF FABRICATING THE SEMICONDUCTOR DEVICE

BACKGROUND

DC-DC power conversion for servers, high performance computing (HPC), and artificial intelligence (AI) demand higher efficiency and higher density. As frequencies increase, the figure-of-merit FOMoss=Rdson*Coss becomes a dominant power loss mechanism, where Rdson is on-resistance and Coss is output charge. Some conventional power semiconductor devices used in DC-DC power conversion systems utilize a field plate design having a stripe geometry, where the field plate is used to compensate the drift region. In these devices, FOMoss has been reduced by pitch shrink. However, further reductions in FOMoss is challenging with this device geometry. Monolithic devices may be used for high frequency DC-DC power conversion, but these devices are not capable of vertical power flow. GaN devices may be for high frequency power conversion, but many challenges such as cost, reliability, and technical implementation must be overcome. Capacitor integration can help reduce Vds (drain-to-source voltage) overshoot, but this increases cost and/or complexity of the product.

Thus, there is a need for an improved semiconductor device design for DC-DC power conversion systems.

SUMMARY

According to an embodiment of a semiconductor device, the semiconductor device comprises: a semiconductor body; and a plurality of transistor cells formed in the semiconductor body, wherein the plurality of transistor cells comprises: a plurality of stripe-shape gate trenches formed in a first main surface of the semiconductor body; and a plurality of field plate trenches separate from the stripe-shape gate trenches, wherein at least one field plate trench is laterally interposed between each pair of neighboring stripe-shape gate trenches, wherein each stripe-shape gate trench includes a gate electrode, a gate dielectric between the gate electrode and a sidewall of the stripe-shape gate trench, and an oxide between the gate electrode and a bottom of the stripe-shape gate trench, the oxide having a vertical thickness that is greater than eight times a lateral thickness of the gate dielectric and/or greater than a vertical thickness of the gate electrode.

According to an embodiment of a method of producing a semiconductor device, the method comprises: forming a plurality of transistor cells in a semiconductor body, wherein forming the plurality of transistor cells comprises: forming a plurality of stripe-shape gate trenches in a first main surface of the semiconductor body; and forming a plurality of field plate trenches separate from the stripe-shape gate trenches, wherein at least one field plate trench is laterally interposed between each pair of neighboring stripe-shape gate trenches, wherein each stripe-shape gate trench includes a gate electrode, a gate dielectric between the gate electrode and a sidewall of the stripe-shape gate trench, and an oxide between the gate electrode and a bottom of the stripe-shape gate trench, the oxide having a vertical thickness that is greater than eight times a lateral thickness of the gate dielectric and/or greater than a vertical thickness of the gate electrode.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a semiconductor device such as a power MOSFET (metal-oxide-semiconductor field-effect transistor) that has a thick dielectric region at the bottom of stripe-shape gate trenches. The thick dielectric region together with a field plate trench significantly reduces FOMoss and Vds overshoot in a power stage product such as a half bridge or full bridge of a DC-DC power conversion system. The field plate trenches may be needle-shape and therefore have less field plate capacitance area, but still deplete the neighboring semiconductor mesa and achieve good Rdson (on-resistance). FOMoss may be reduced by up to 50% compared to standard stripe dual polysilicon devices where both the gate and field plate trenches are stripe-shape. A diode may be integrated in the field plate trench to tune the field plate resistance (Ross), for further reducing Vds overshoot.

Described next with reference to the figures are embodiments of the semiconductor device and a method of producing the semiconductor device.

Figure 1:
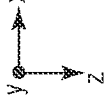
FIG. 1 illustrates a partial cross-sectional view of a semiconductor device.
Figure 1:
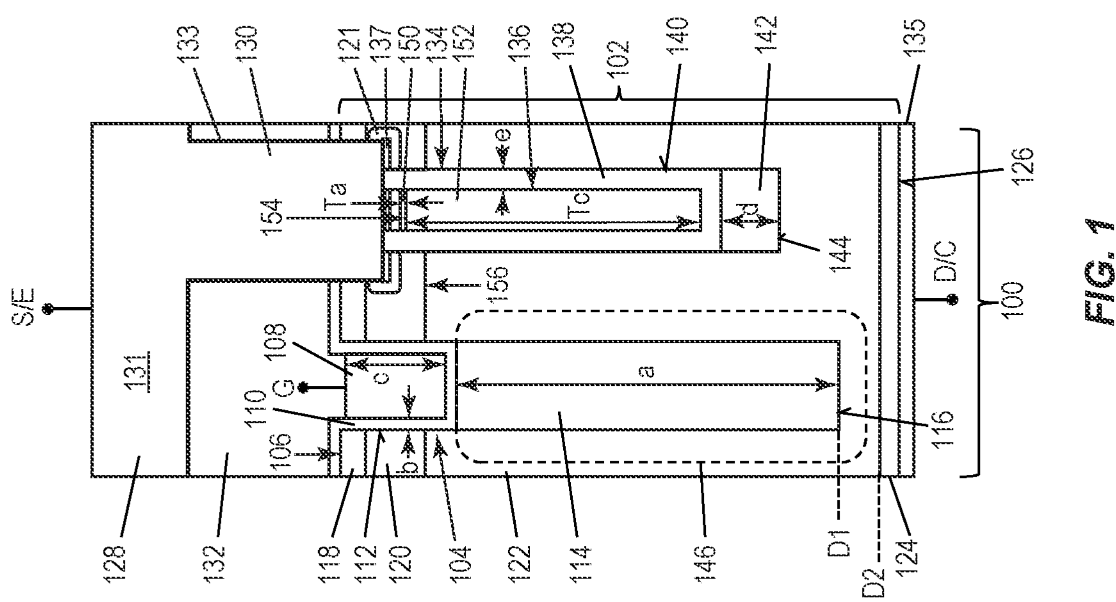

FIG. 1 illustrates a partial cross-sectional view of a semiconductor device in the region of a transistor cell 100 formed in a semiconductor body 102. The transistor cells 100 are electrically coupled in parallel to form a power transistor such as a vertical power MOSFET (metal-oxide-semiconductor field-effect transistor), an IGBT (insulated gate bipolar transistor), a JFET (junction FET), etc., where the transistor cells 100 have the same or similar construction. In general, the semiconductor device may have tens, hundreds, thousands, or even more transistors cells 100.

The semiconductor body 102 in which the transistor cells 100 are formed comprises one or more semiconductor materials that are used to form a power semiconductor device such as, e.g., a Si or SiC power MOSFET. For example, the semiconductor body 102 may comprise Si, silicon carbide (SiC), germanium (Ge), silicon germanium (SiGe), gallium nitride (GaN), gallium arsenide (GaAs), and the like. The semiconductor body 100 may include one or more epitaxial layers.

The transistor cells 100 formed in the semiconductor body 102 include stripe-shape gate trenches 104 formed in a first main surface 106 of the semiconductor body 102. The term 'stripe-shape' as used herein means a structure having a longest linear dimension in a direction (y direction in FIG.

1) generally perpendicular to the depth-wise direction (z direction in FIG. 1) of the semiconductor substrate 102. Each stripe-shape gate trench 104 includes a gate electrode 108, a gate dielectric 110 between the gate electrode 108 and a sidewall 112 of the stripe-shape gate trench 104, and an oxide 114 between the gate electrode 108 and a bottom 116 of the stripe-shape gate trench 104. The oxide 114 has a vertical thickness 'a' that is greater than eight (8) times a lateral thickness 'b' of the gate dielectric 110 and/or greater than a vertical thickness 'c' of the gate electrode 108 and therefore is relatively thick compared to other oxides formed in the semiconductor body 102. The vertical thicknesses 'a' and 'c' are measured in the z direction in FIG. 1, whereas the lateral thickness 'b' is measured in the x direction in FIG. 1.

Each transistor cell 100 further includes a source/emitter region 118 of a first conductivity type and a body region 120 of a second conductivity type opposite the first conductivity type. The source/emitter region 118 of each transistor cell 100 is separated from a (common) drift zone 122 of the first conductivity type by the corresponding body region 120. In the case of a vertical power transistor, a drain or collector 124 is disposed at the backside 126 of the semiconductor body 102.

The first conductivity is n-type and the second conductivity type is p-type for an n-channel device formed by the transistor cells 100, whereas the first conductivity is p-type and the second conductivity type is n-type for a p-channel device formed by the transistor cells 100. For either an n-channel device or a p-channel device, the source/emitter region 118 and the body region 120 form part of a transistor cell 100 and the transistor cells 100 are electrically connected in parallel between source (S)/emitter (E) and drain (D)/collector (C) terminals of the semiconductor device to form a power transistor.

The body regions 120 of the transistor cells 100 may include a body contact region 121 of the second conductivity type. The body contact region 121 has a higher doping concentration than the body regions 120, to provide an ohmic connection with a source/emitter metallization 128 through a contact structure 130 such as electrically conductive vias that extends through an interlayer dielectric 132 separating the source/emitter metallization 128 from the semiconductor body 100. The source/emitter regions 118 of the transistor cells 100 are also electrically connected to the source/emitter metallization 128 through the contact structure 130.

The gate electrodes 108 are electrically connected to a gate terminal (G) through, e.g., a gate metallization which is not shown in the figures. The gate metallization may be part of a structured power metallization that also includes the source/emitter metallization 128. Such a structured power metallization may include a thick power metal layer 131 that comprises Cu, Al, AlCu, AlSiCu, etc., a diffusion barrier and/or adhesion promoter 133 such as Ti and/or TiN and/or W between the thick power metal layer 131 and the interlayer dielectric 132. A drain/collector metallization 135 is provided at the opposite side 126 of the semiconductor body 102 as the source/emitter metallization 128.

The semiconductor device also includes field plate trenches 134 that are separate from the stripe-shape gate trenches 104, with at least one field plate trench 134 laterally interposed between each pair of neighboring stripe-shape gate trenches 104. In one embodiment, the field plate trenches 134 are needle-shape and arranged in a grid between pairs of neighboring stripe-shape gate trenches 104. For example, needle-shape field plate trenches 134 may be arranged in a rectangular grid, a hexagonal grid, etc. According to this embodiment, more than one field plate trench 134 is laterally interposed between each pair of neighboring stripe-shape gate trenches 104, e.g., as shown in the partial top plan view of FIG. 2 which shows a region of the semiconductor body 102 where two (2) stripe-shape gate trenches 104 are formed in the first main surface 106 of the semiconductor body 102. In the case of needle-shape field plate trenches 134, the stripe-shape gate trenches 104 may be wider (x direction in FIGS. 1 and 2) and deeper (z direction in FIGS. 1 and 2) than the field plate trenches 134.

Figure 2:
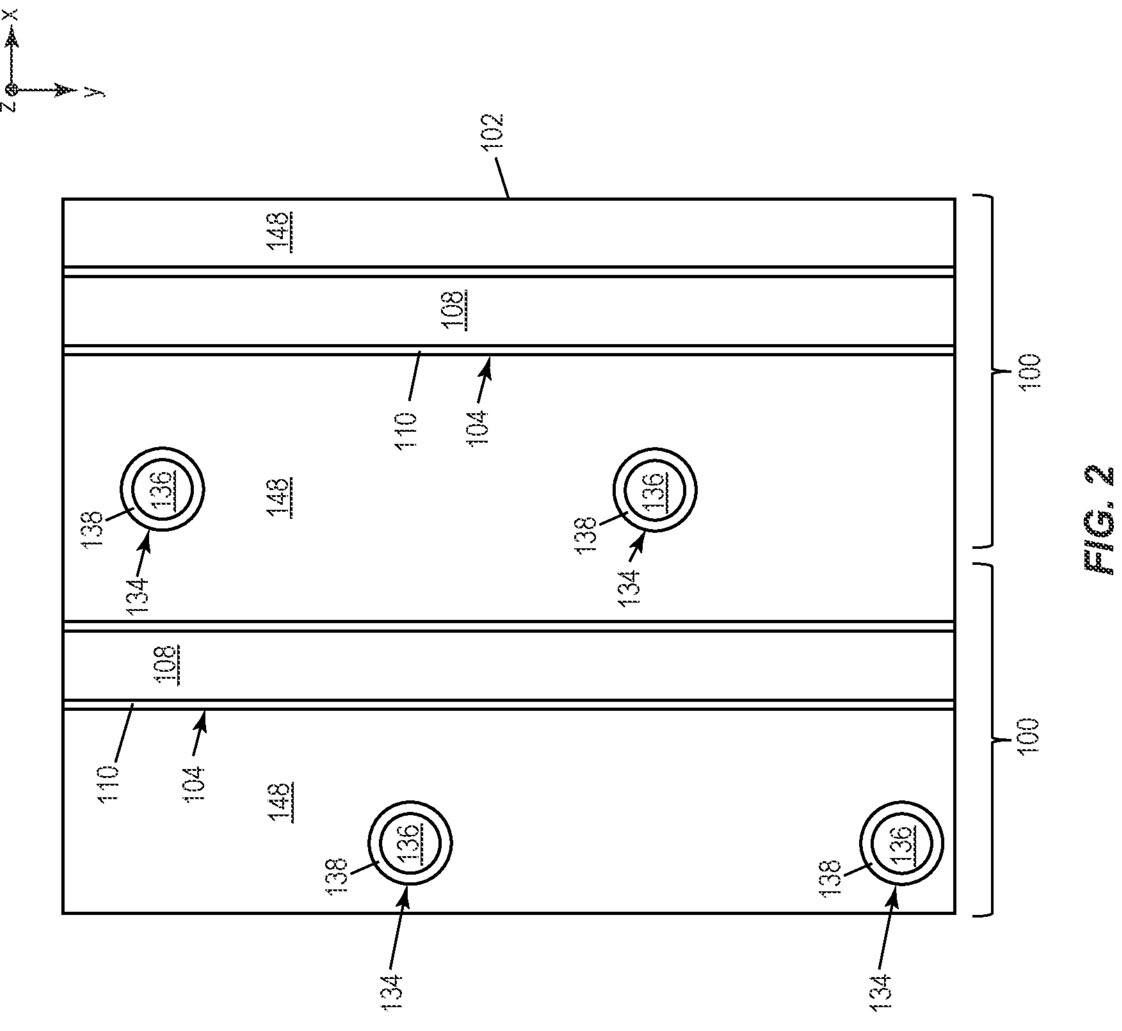
FIG. 2 illustrates a partial top plan view of the semiconductor device, according to an embodiment.

The term 'needle-shape' as used herein means a structure that is narrow in the x and y directions in FIGS. 1 and 2 and long in the depth-wise direction (z direction in FIGS. 1 and 2) of the semiconductor body 102. For example, in the case of needle-shape field plate trenches 134, the needle-shape field plate trenches 134 may resemble needles, columns, pillars, or spicules in the depth-wise direction of the semiconductor body 102.

In another embodiment, the field plate trenches 134 are stripe-shape. According to this embodiment, a single field plate trench 134 is laterally interposed between each pair of neighboring stripe-shape gate trenches 104, e.g., as shown in the partial top plan view of FIG. 3 which shows a region of the semiconductor body 102 where two (2) stripe-shape gate trenches 104 are formed in the first main surface 106 of the semiconductor body 102.

In both the stripe-shape and needle-shape embodiments of the field plate trenches 134, the field plate trenches 134 extend from the first main surface 106 of the semiconductor body 102 and into the semiconductor body 102. Field plates 136 are disposed in the field plate trenches 134. The field plates 136 may be electrically connected to the source/emitter metallization 128 through the contact structure 130 which may include a silicide (e.g., Ti) region 137 formed in the semiconductor body 102. A dielectric 138 is interposed between the field plate 136 and a sidewall 140 of the corresponding field plate trench 134. An oxide 142 is interposed between the field plate 136 and the bottom 144 of the corresponding field plate trench 134. In one embodiment, the oxide 142 at the bottom 144 of the field plate trenches 134 has a vertical thickness 'd' that is greater than a lateral thickness 'e' of the dielectric interposed between the field plates 136 and the sidewall 140 of the field plate trenches 134. The vertical thicknesses 'd' is measured in the z direction in FIG. 1, whereas the lateral thickness 'e' is measured in the x direction in FIG. 1.

The relatively thick oxide 114 at the bottom 116 of the stripe-shape gate trenches 104 in conjunction with the field plate trenches 134 significantly reduces FOMoss and Vds overshoot. The relatively thick gate trench bottom oxide 114 reduces the gate-to-drain capacitance and FOMoss. If the relatively thick gate trench bottom oxide 114 was omitted, a higher gate-to-drain capacitance would result and false turn on of the device may occur.

In one embodiment, the oxide 114 at the bottom 116 of the stripe-shape gate trenches 104 terminates at a depth D1 in the semiconductor body 102 measured from the first main surface 106 and that corresponds to at least 30% of a vertical thickness D2 of the drift zone 122. For example, the relatively thick gate trench bottom oxide 114 may terminate at a depth D1 in the semiconductor body 102 that corresponds to at least 50% of the vertical thickness D2 of the drift zone 122.

The oxide 114 at the bottom 116 of the stripe-shape gate trenches 104 may be under compressive stress and the region 146 of the semiconductor body 102 that adjoins the relatively thick gate trench bottom oxide 114 may have tensile strain, such that carrier mobility (e.g., electron mobility for an n-channel device) is increased in the region 146 of the semiconductor body 102 that adjoins the relatively thick gate trench bottom oxide 114. This in turn reduces Rdson. For example, the region 146 of the drift zone 122 that adjoins the oxide 114 at the bottom 116 of the stripe-shape gate trenches 104 may have tensile strain over at least 30% of the vertical thickness D2 of the drift zone 122.

Annealing of the oxide 114 at the bottom 116 of the stripe-shape gate trenches 104 may yield compressive stress, imparting tensile stress into the region 146 of the semiconductor body 102 that adjoins the relatively thick gate trench bottom oxide 114. The greater the volume of the relatively thick gate trench bottom oxide 114, the greater the strain effect. Since the relatively thick gate trench bottom oxide 114 may extend over a majority (>50%, >60%, >70%, >80% or more) of the drift zone thickness D2, the carrier mobility improvement can be quite significant.

In the case of needle-shape field plate trenches 134, FOMoss is further reduced since there is less field plate capacitance area. Needle-shape field plate trenches 134 still deplete the semiconductor mesas 148 delimited by each pair of neighboring stripe-shape gate trenches 104, achieving good Rdson with lower FOMoss.

The field plate 136 in each field plate trench 134 may include an integrated diode. Simulations show the integrated diode may further reduce FOMoss. In one embodiment, the integrated diode comprises a p-type anode 150 and an n-type cathode 152 below the anode 150 and having a greater vertical thickness (Tc>Ta) than the anode 150 where the vertical thickness is measured along the z direction in FIGS. 1 through 3. The anode 150 of each integrated diode may be contacted by the same contact structure 130 and source/emitter metallization 128 as the body region 120 of the transistor cells 100. The potential of the cathode 152 of the integrated diodes is not zero during switching because the integrated diode takes a higher potential which results in less voltage drop and yields less capacitance, leading to better efficiency, e.g., for a synchronous buck converter operating at 2 MHz.

The integrated diodes in the field plate trenches 134 reduce voltage ringing which helps to avoid Vds overshoot and avalanche conditions. With high dV/dt in the drift zone 122, the voltage drop over the integrated diodes in the field plate trenches 134 exceeds the critical value and the integrated diodes enter avalanche. Therefore, the integrated diodes reduce the drain-source voltage overshoot because energy is burned during the avalanche event and dV/dt is slowed down. Without the integrated diodes in the field plate trenches 134, Vds ringing may occur which requires a device with a higher voltage rating.

The depth (z direction in FIGS. 1 through 3) of the pn junction 154 between the anode 150 and the cathode 152 of each integrated diode in the field plate trenches 134 relative to the depth of the pn junction 154 between the body region 120 and the drift zone 122 of the transistor cells 100 depends on several parameters. For example, with reference to the first main surface 106 of the semiconductor body 102, the pn junction 154 between the body region 120 and the drift zone 122 of the transistor cells 100 may be shallower than the pn junction 156 between the anode 150 and the cathode 152 of each integrated diode in the field plate trenches 134. This may be the case if the transistor cells 100 have shallower MOSFET junctions and the integrated diode is formed of polysilicon which has higher diffusion than Si, for example. However, as shown in FIG. 1, the pn junction 156 between the body region 120 and the drift zone 122 of the transistor cells 100 instead may be deeper than the pn junction 154 between the anode 150 and the cathode 152 of each integrated diode in the field plate trenches 134.

Also as shown in FIG. 1, the field plate trenches 134 may be recessed below the first main surface 106 of the semiconductor body 102, e.g., due to the contact structure 130 being recessed into the first main surface 106. In this case, the anode 150 of each integrated diode may be disposed below the level of the source region 118 of the transistor cells 100. In FIG. 1, the anode 150 of each integrated diode is disposed at the level of the body region 120 of the transistor cells 100.

FIGS. 4A through 4K illustrate the same partial cross-sectional view of the semiconductor device as FIG. 1 but during different stages of production, according to an embodiment.

Figure 3:
FIG. 3 illustrates a partial top plan view of the semiconductor device, according to another embodiment.
Figure 3:
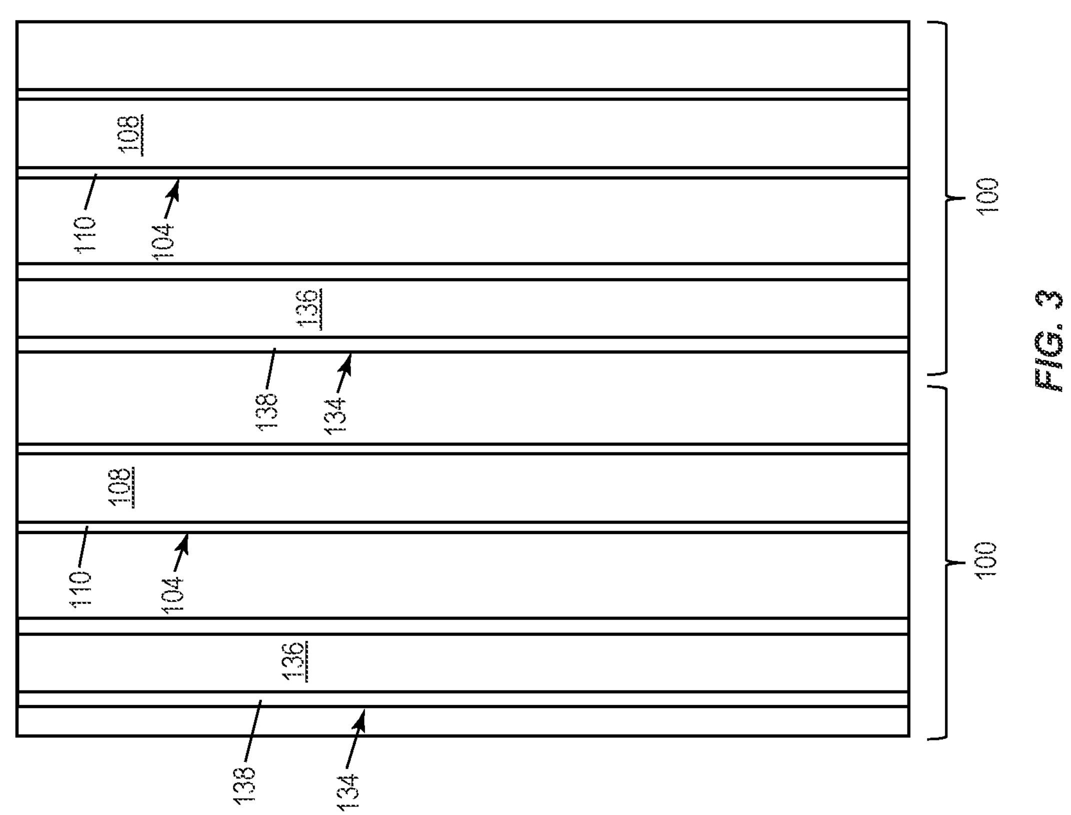
Figures 4A, 4B, 4C:
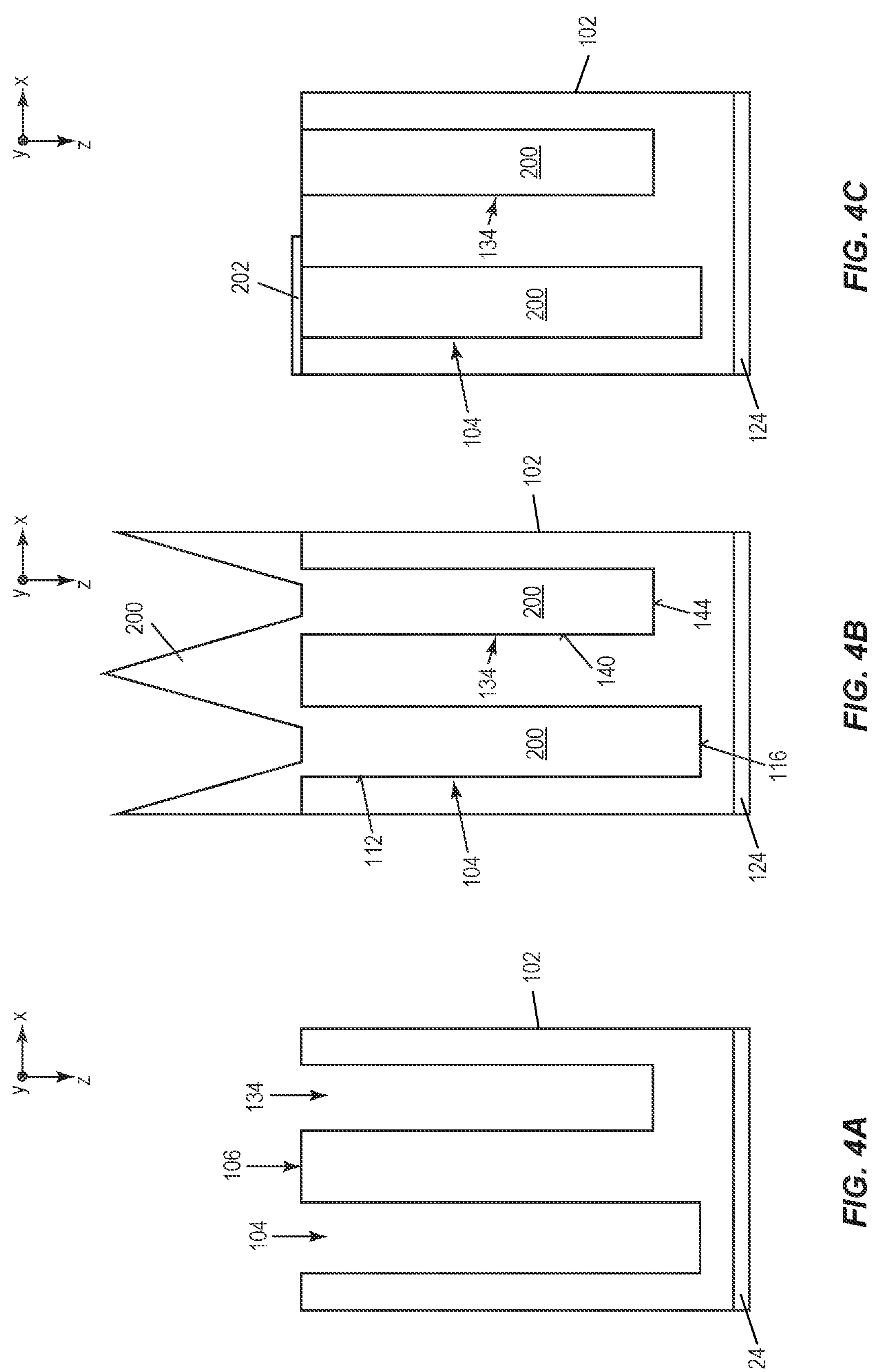
FIGS. 4A through 4K illustrate the same partial cross-sectional view of the semiconductor device in FIG. 1 during different stages of production, according to an embodiment.

FIG. 4A shows the semiconductor body 102 after etching the stripe-shape gate trenches 104 and the field plate trenches 134 into the first main surface 106 of the semiconductor body 102. The stripe-shape gate trenches 104 and the field plate trenches 134 may be formed via a common lithography process that involves the same mask and etching at the same time. The field plate trenches 134 may be needle-shape as shown in FIG. 2 or stripe-shape as shown in FIG. 3. In the case of needle-shape field plate trenches 134, the stripe-shape gate trenches 104 etch faster than the needle-shape field plate trenches 134 and therefore extend deeper into the semiconductor body 102 than the needle-shape field plate field plate trenches 134. The stripe-shape gate trenches 104 also may be wider (x direction in FIG. 4A) than the field plate trenches 134.

FIG. 4B shows the semiconductor body 102 after a high-density-plasma (HDP) chemical vapor deposition (CVD) process that fills both types of trenches 104, 134 with an oxide 200. The HDP CVD process may be an iterative process because of the high aspect ratio of the trenches 104, 132. The iterative HDP CVD process includes a plurality of HPD CVD steps interleaved with wet etching to reliably fill both types of trenches 104, 134 with oxide 200. The first deposition and wet etch removes the deposited oxide from the trench sidewalls 112, 140 but not completely from the trench bottoms 116, 144. The wet etching avoids too much oxide deposition; otherwise, the oxide will grow together at the upper part of the trenches 104 and 134 and may result in oxide voiding. The iterative HDP CVD process continues until the trenches 104, 134 are filled with oxide 200.

FIG. 4C shows the semiconductor body 102 after the HDP oxide 200 is removed from the first main surface 106 of the semiconductor body 102. For example, trench depth may be optically measured and a planarization process such as chemical-mechanical polishing (CMP) continues until the target depth is reached. FIG. 4C also shows the stripe-shape gate trenches 104 protected by a hard mask 202 such as nitride.

Figures 4D, 4E:
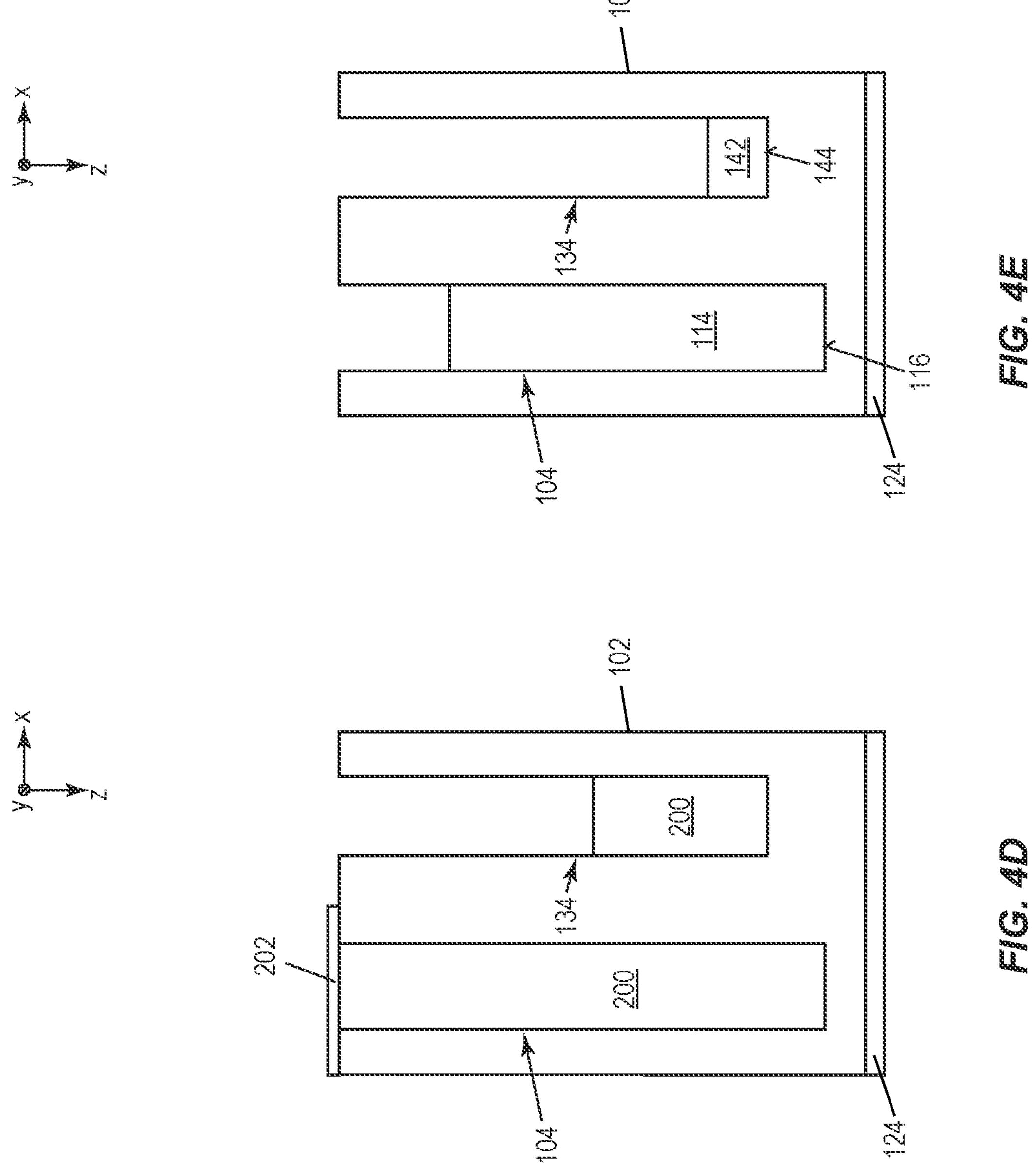

FIG. 4D shows the semiconductor body 102 after a first (rough) etch of the HDP oxide 200 in the field plate trenches 134 while the HDP oxide 200 in the stripe-shape gate trenches 104 is protected by the hard mask 202. A plasma etch may be used but the plasma etch may round the top corners of the field plate trenches 134 and lead to wafer irregularities. A wet etch avoids this problem.

FIG. 4E shows the semiconductor body 102 after the hard mask 202 is removed and the same oxide etch process is applied to both types of trenches 104, 134. Some HDP oxide remains at the bottom 144 of the field plate trenches 134 so that the field plate trenches 134 have a thicker oxide 142 at the trench bottom 144. The HDP oxide that remains in the stripe-shape gate trenches 104 forms the relatively thick bottom oxide 114 at the bottom 116 of the stripe-shape gate trenches 104.

Figures 4F, 4G, 4H:
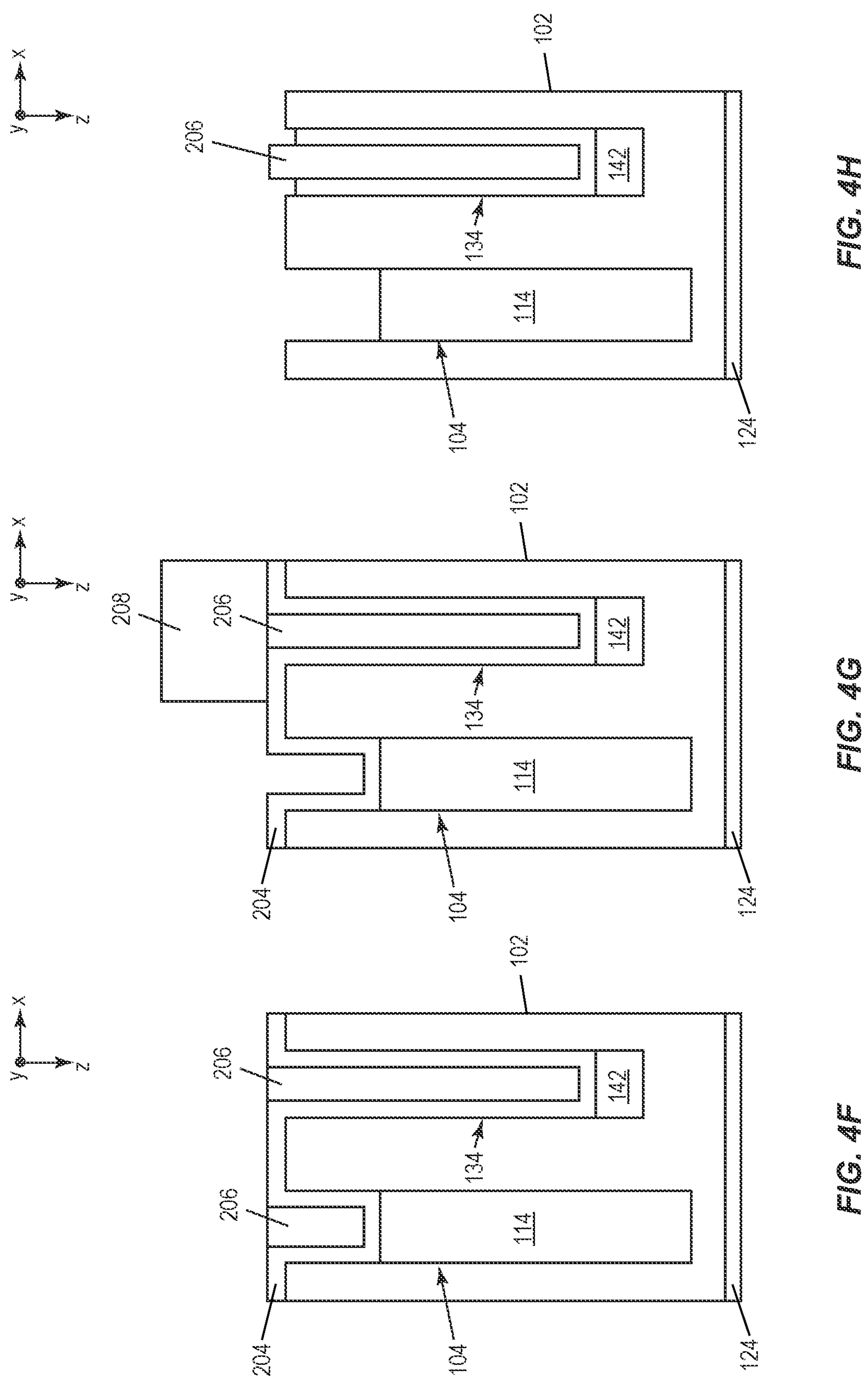

FIG. 4F shows the semiconductor body 102 after a dielectric material 204 such as a field oxide layer is deposited on the upper part of the sidewalls 112 of the trenches 104, 134 and on the HDP oxide 114, 142 that remains in the trenches 104, 134. FIG. 4F also shows doped polysilicon 206 deposited on the field oxide layer 204 in the trenches 104, 134. The deposited polysilicon 206 is doped to form a cathode of a diode that is to be integrated into the field plate trenches 134. The integrated diode instead may be omitted.

FIG. 4G shows the semiconductor body 102 after the field plate trenches 134 are covered by a lithographic mask 208 and the polysilicon 206 is removed from the stripe-shape gate trenches 104. The polysilicon 206 may be removed from the stripe-shape gate trenches 104 by plasma or wet etching, for example.

FIG. 4H shows the semiconductor body 102 after the field oxide layer 204 is removed from the stripe-shape gate trenches 104.

Figures 4I, 4J, 4K:
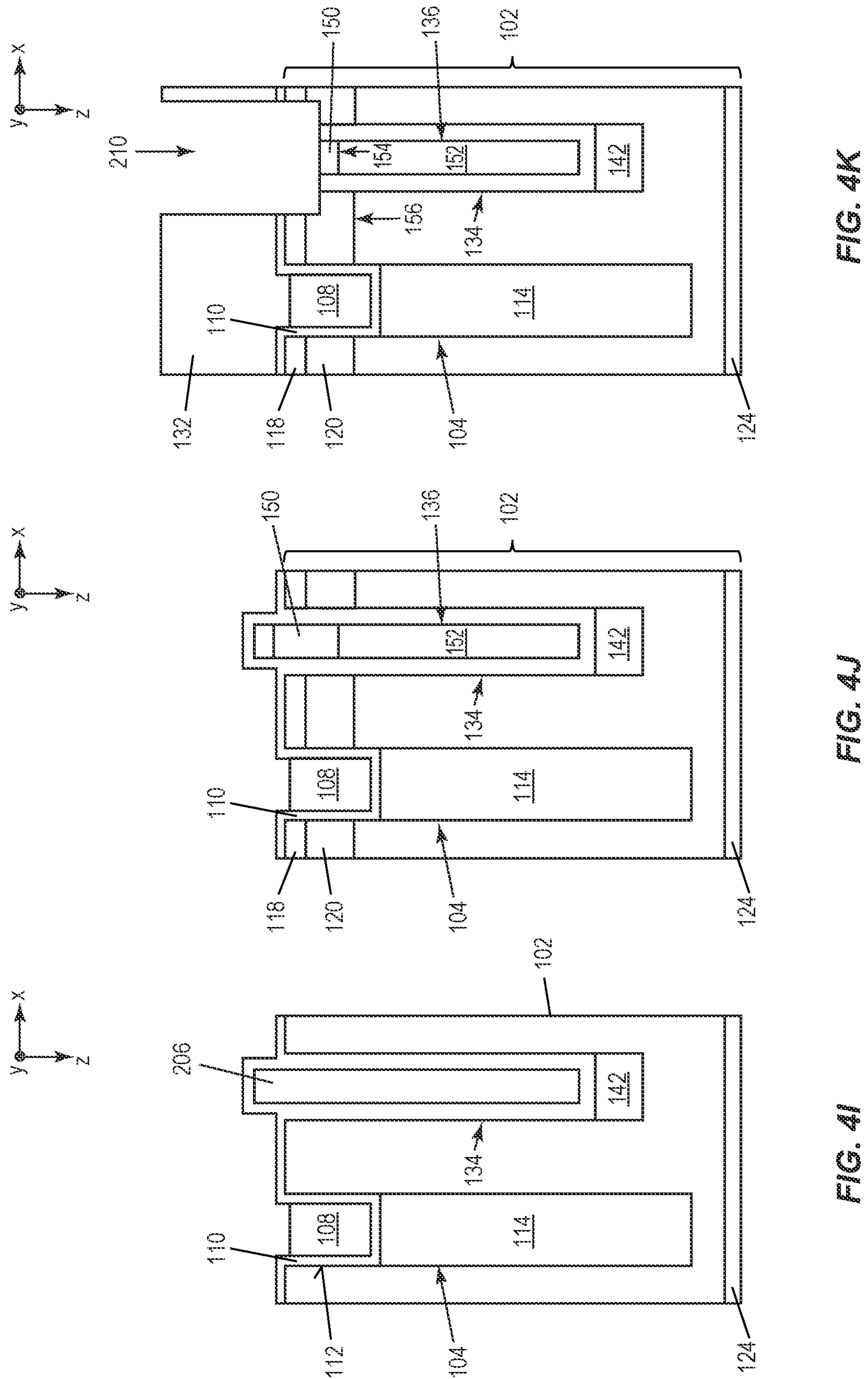

FIG. 4I shows the semiconductor body 102 after forming the gate dielectric 110 on the upper part of the sidewall of the stripe-shape gate trenches 104 and forming the gate electrode 108 such that the gate electrode 108 is separated from the surrounding semiconductor material by the gate dielectric 110. The gate dielectric 110 may be a thermally grown oxide or a deposited oxide such as $SiO_2$ formed by atomic layer deposition (ALD) followed by rapid thermal annealing (RTP) to densify the $SiO_2$. The gate electrode 108 may comprise just polysilicon, just metal, or a layer stack that includes both polysilicon and metal where the term 'metal' refers to both pure metal and metal alloys.

FIG. 4J shows the semiconductor body 102 after forming the body region 120 of the transistor cells 100 as part of a common body region formation process and forming the source region 118 of the transistor cells 100 as part of a common source region formation process. The source dopant species (e.g., n-type for an n-channel device) and the body dopant species (e.g., p-type for an n-channel device) may be implanted through the gate dielectric 110 or the gate dielectric 110 may be removed from the first main surface 106 of the semiconductor body 102 and a scattering oxide formed on the first main surface 106 and through which the source and body dopant species are implanted.

If a diode is to be integrated in the field plate trenches 134, the field plate trenches 134 may be unmasked during the common body region and common source region formation processes. This results in the uppermost part of the polysilicon 206 in the field plate trenches 134 having the source conductivity type (e.g., n-type for an n-channel device) and the next lower region of the polysilicon 206 having the body conductivity type (e.g., p-type for an n-channel device). The body dopant species functions as an anode dopant species in the field plate trenches 134 during the common body region formation process. The region of the polysilicon 206 in the field plate trenches 134 having the body conductivity type forms the anode 150 of the integrated diode. More generally, the anode 150 of the diode integrated into the field plate trenches 134 may be formed by a body contact implant (e.g., $BF_2$) that forms the body contact regions 121 (see FIG. 1) and/or by the body region implant and/or by a separate anode implant.

The part of the polysilicon 206 below the anode 150 forms the cathode 152 of the integrated diode. The cathode doping may be carried out during deposition of the polysilicon 205, for example. Thermal processing performed as part of the common body region and common source region formation processes may provide the desired anode and cathode doping profiles in the field plate trenches 134.

The parameters of this annealing and/or a different annealing may be chosen such that the relatively thick oxide 114 at the bottom 116 of the stripe-shape gate trenches 104 is under compressive stress and a region 146 (see FIG. 1) of the semiconductor body 102 that adjoins the gate trench bottom oxide 114 has tensile strain, such that carrier mobility (e.g., electron mobility in the case of an n-channel device) is increased in the region 146 of the semiconductor body 102 that adjoins the oxide 114.

FIG. 4K shows the semiconductor body 102 after an interlayer dielectric 132 is formed over the first main surface 106 of the semiconductor body 102 and a contact opening 210 is formed in the interlayer dielectric 132. The contact opening 210 exposes the field plate trenches 134 formed in the semiconductor body 102. The contact opening 210 may be etched into the first main surface 106 of the semiconductor body 102 to recess an upper part of the semiconductor body 102 in a region of the field plate trenches 134, such that the field plate trenches 134 are recessed below the first main surface 106 of the semiconductor body 102 and the anode 150 of each integrated diode is disposed below a level of the source region 118 of the transistor cells 100.

This recess etching removes the polysilicon 206 from the upper end of the field plate trenches 134. As shown in FIG. 4K, the remaining diode junction 154 in the field plate trenches 134 may be at a higher position (in the z direction) than the pn junction 156 with the drift zone 122 of the transistor cells 100.

A contact to the anode 150 of each integrated diode is then formed, the contact being at source potential as an example. The diode contacts may be part of the contact structure 130 shown in FIG. 1. The source/emitter metallization 128, drain/collector metallization 135 and gate metallization (not shown) are also formed, as shown in FIG. 1.

The semiconductor device described herein has several advantages over a standard stripe dual polysilicon device where both the gate and field plate trenches are stripe-shape. First, the thick oxide 114 at the bottom of the stripe-shape gate trenches 104 shields the gate electrode 108 from drain potential. Second, the relatively thick gate trench bottom oxide 114 combined with needle-shape field plate trenches 134 provides charge compensation that enables a balanced trade-off of Rdson and output charge. Third, the relatively thick gate trench bottom oxide 114 may introduce beneficial stress to the drift zone 122, increasing carrier mobility (e.g., electron mobility for an n-channel device) and reducing Rdson. Fourth, the output charge of each transistor cell 100 is greatly reduced since the area of source-drain capacitance from the field plates 136 is substantially reduced compared to a stripe dual polysilicon device. Fifth, the integrated diode in the field plate trenches 134 further reduces the output charge by changing the potential of the field plates 136, and reducing Vds overshoot during switching due to the effective resistance introduced by the integrated diode.

Although the present disclosure is not so limited, the following numbered examples demonstrate one or more aspects of the disclosure.

Example 1. A semiconductor device, comprising: a semiconductor body; and a plurality of transistor cells formed in the semiconductor body, wherein the plurality of transistor cells comprises: a plurality of stripe-shape gate trenches formed in a first main surface of the semiconductor body; and a plurality of field plate trenches separate from the stripe-shape gate trenches, wherein at least one field plate trench is laterally interposed between each pair of neighboring stripe-shape gate trenches, wherein each stripe-shape gate trench includes a gate electrode, a gate dielectric between the gate electrode and a sidewall of the stripe-shape gate trench, and an oxide between the gate electrode and a bottom of the stripe-shape gate trench, the oxide having a vertical thickness that is greater than eight times a lateral thickness of the gate dielectric and/or greater than a vertical thickness of the gate electrode.

Example 2. The semiconductor device of example 1, wherein the field plate trenches are needle-shape and arranged in a grid between pairs of neighboring stripe-shape gate trenches.

Example 3. The semiconductor device of example 2, wherein the stripe-shape gate trenches are wider and deeper than the field plate trenches.

Example 4. The semiconductor device of any of examples 1 through 3, wherein the stripe-shape gate trenches extend into a drift zone common to the plurality of transistor cells, and wherein the oxide in the stripe-shape gate trenches terminates at a depth in the semiconductor body that corresponds to at least 30% of a vertical thickness of the drift zone.

Example 5. The semiconductor device of example 4, wherein the oxide in the stripe-shape gate trenches terminates at a depth in the semiconductor body that corresponds to at least 50% of the vertical thickness of the drift zone.

Example 6. The semiconductor device of any of examples 1 through 5, wherein the oxide in the stripe-shape gate trenches is under compressive stress and a region of the semiconductor body that adjoins the oxide has tensile strain such that carrier mobility is increased in the region of the semiconductor body that adjoins the oxide.

Example 7. The semiconductor device of example 6, wherein the stripe-shape gate trenches extend into a drift zone common to the plurality of transistor cells, and wherein a region of the drift zone that adjoins the oxide has tensile strain over at least 30% of a vertical thickness of the drift zone.

Example 8. The semiconductor device of any of examples 1 through 7, wherein a field plate in each field plate trench comprises an integrated diode.

Example 9. The semiconductor device of example 8, wherein the integrated diode comprises an anode and a cathode below the anode and having a greater vertical thickness than the anode.

Example 10. The semiconductor device of example 9, wherein with reference to the first main surface of the semiconductor body, a pn junction between a body region and a drift zone of the plurality of transistor cells is shallower than a pn junction between the anode and the cathode of each integrated diode.

Example 11. The semiconductor device of example 9, wherein with reference to the first main surface of the semiconductor body, a pn junction between a body region and a drift zone of the plurality of transistor cells is deeper than a pn junction between the anode and the cathode of each integrated diode.

Example 12. The semiconductor device of any of examples 9 through 11, wherein the field plate trenches are recessed below the first main surface of the semiconductor body such that the anode of each integrated diode is disposed below a level of a source region of the plurality of transistor cells.

Example 13. The semiconductor device of any of examples 1 through 12, wherein each field plate trench includes a field plate, a dielectric between the field plate and a sidewall of the field plate trench, and an oxide between the field plate and a bottom of the field plate trench, the oxide having a vertical thickness that is greater than a lateral thickness of the dielectric.

Example 14. A method of producing a semiconductor device, the method comprising: forming a plurality of transistor cells in a semiconductor body, wherein forming the plurality of transistor cells comprises: forming a plurality of stripe-shape gate trenches in a first main surface of the semiconductor body; and forming a plurality of field plate trenches separate from the stripe-shape gate trenches, wherein at least one field plate trench is laterally interposed between each pair of neighboring stripe-shape gate trenches, wherein each stripe-shape gate trench includes a gate electrode, a gate dielectric between the gate electrode and a sidewall of the stripe-shape gate trench, and an oxide between the gate electrode and a bottom of the stripe-shape gate trench, the oxide having a vertical thickness that is greater than eight times a lateral thickness of the gate dielectric and/or greater than a vertical thickness of the gate electrode.

Example 15. The method of example 14, wherein the field plate trenches are needle-shape and arranged in a grid between pairs of neighboring stripe-shape gate trenches, wherein the stripe-shape gate trenches and the field plate trenches are formed via a common lithography process, and wherein the stripe-shape gate trenches are wider and deeper than the field plate trenches.

Example 16. The method of example 14 or 15, wherein the oxide is formed in the stripe-shape gate trenches via an iterative process that includes a plurality of high-density-plasma chemical vapor deposition steps interleaved with wet etching.

Example 17. The method of any of examples 14 through 16, further comprising: annealing the oxide in the stripe-shape gate trenches such that the oxide is under compressive stress and a region of the semiconductor body that adjoins the oxide has tensile strain such that carrier mobility is increased in the region of the semiconductor body that adjoins the oxide.

Example 18. The method of any of examples 14 through 17, further comprising: integrating a diode into a field plate of each field plate trench.

Example 19. The method of example 18, wherein each diode comprises an anode and a cathode below the anode and having a greater vertical thickness than the anode.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:

a semiconductor body; and a plurality of transistor cells formed in the semiconductor body, wherein the plurality of transistor cells comprises:

a plurality of stripe-shape gate trenches formed in a first main surface of the semiconductor body; and a plurality of field plate trenches separate from the stripe-shape gate trenches, wherein at least one field plate trench is laterally interposed between each pair of neighboring stripe-shape gate trenches, wherein each stripe-shape gate trench includes a gate electrode, a gate dielectric between the gate electrode and a sidewall of the stripe-shape gate trench, and an oxide between the gate electrode and a bottom of the stripe-shape gate trench, the oxide having a vertical thickness that is greater than eight times a lateral thickness of the gate dielectric and/or greater than a vertical thickness of the gate electrode, wherein the field plate trenches are needle-shape and arranged in a grid between pairs of neighboring stripe-shape gate trenches, wherein the stripe-shape gate trenches are wider and deeper than the field plate trenches.

2. The semiconductor device of claim 1, wherein the stripe-shape gate trenches extend into a drift zone common to the plurality of transistor cells, and wherein the oxide in the stripe-shape gate trenches terminates at a depth in the semiconductor body that corresponds to at least 30% of a vertical thickness of the drift zone.

3. The semiconductor device of claim 2, wherein the oxide in the stripe-shape gate trenches terminates at a depth in the semiconductor body that corresponds to at least 50% of the vertical thickness of the drift zone.

4. The semiconductor device of claim 1, wherein the oxide in the stripe-shape gate trenches is under compressive stress and a region of the semiconductor body that adjoins the oxide has tensile strain such that carrier mobility is increased in the region of the semiconductor body that adjoins the oxide.

5. The semiconductor device of claim 4, wherein the stripe-shape gate trenches extend into a drift zone common to the plurality of transistor cells, and wherein a region of the drift zone that adjoins the oxide has tensile strain over at least 30% of a vertical thickness of the drift zone.

6. The semiconductor device of claim 1, wherein a field plate in each field plate trench comprises an integrated diode.

7. The semiconductor device of claim 6, wherein the integrated diode comprises an anode and a cathode below the anode and having a greater vertical thickness than the anode.

8. The semiconductor device of claim 7, wherein with reference to the first main surface of the semiconductor body, a pn junction between a body region and a drift zone of the plurality of transistor cells is shallower than a pn junction between the anode and the cathode of each integrated diode.

9. The semiconductor device of claim 7, wherein with reference to the first main surface of the semiconductor body, a pn junction between a body region and a drift zone of the plurality of transistor cells is deeper than a pn junction between the anode and the cathode of each integrated diode.

10. The semiconductor device of claim 7, wherein the field plate trenches are recessed below the first main surface of the semiconductor body such that the anode of each integrated diode is disposed below a level of a source region of the plurality of transistor cells.

11. The semiconductor device of claim 1, wherein each field plate trench includes a field plate, a dielectric between the field plate and a sidewall of the field plate trench, and an oxide between the field plate and a bottom of the field plate trench, the oxide having a vertical thickness that is greater than a lateral thickness of the dielectric.

12. A semiconductor device, comprising:

a semiconductor body; and a plurality of transistor cells formed in the semiconductor body, wherein the plurality of transistor cells comprises:

a plurality of stripe-shape gate trenches formed in a first main surface of the semiconductor body; and a plurality of field plate trenches separate from the stripe-shape gate trenches, wherein at least one field plate trench is laterally interposed between each pair of neighboring stripe-shape gate trenches, wherein each stripe-shape gate trench includes a gate electrode, a gate dielectric between the gate electrode and a sidewall of the stripe-shape gate trench, and an oxide between the gate electrode and a bottom of the stripe-shape gate trench, the oxide having a vertical thickness that is greater than eight times a lateral thickness of the gate dielectric and/or greater than a vertical thickness of the gate electrode, wherein a field plate in each field plate trench comprises an integrated diode.

13. The semiconductor device of claim 12, wherein the integrated diode comprises an anode and a cathode below the anode and having a greater vertical thickness than the anode.

14. The semiconductor device of claim 13, wherein with reference to the first main surface of the semiconductor body, a pn junction between a body region and a drift zone of the plurality of transistor cells is shallower than a pn junction between the anode and the cathode of each integrated diode.

15. The semiconductor device of claim 13, wherein with reference to the first main surface of the semiconductor body, a pn junction between a body region and a drift zone of the plurality of transistor cells is deeper than a pn junction between the anode and the cathode of each integrated diode.

16. The semiconductor device of claim 13, wherein the field plate trenches are recessed below the first main surface of the semiconductor body such that the anode of each integrated diode is disposed below a level of a source region of the plurality of transistor cells.

17. A semiconductor device, comprising:

a semiconductor body; and a plurality of transistor cells formed in the semiconductor body, wherein the plurality of transistor cells comprises:

a plurality of stripe-shape gate trenches formed in a first main surface of the semiconductor body; and a plurality of field plate trenches separate from the stripe-shape gate trenches, wherein at least one field plate trench is laterally interposed between each pair of neighboring stripe-shape gate trenches, wherein each stripe-shape gate trench includes a gate electrode, a gate dielectric between the gate electrode and a sidewall of the stripe-shape gate trench, and an oxide between the gate electrode and a bottom of the stripe-shape gate trench, the oxide having a vertical thickness that is greater than eight times a lateral thickness of the gate dielectric and/or greater than a vertical thickness of the gate electrode, wherein each field plate trench includes a field plate, a dielectric between the field plate and a sidewall of the field plate trench, and an oxide between the field plate and a bottom of the field plate trench, the oxide having a vertical thickness that is greater than a lateral thickness of the dielectric.

* * * * *